United States Patent
Ma et al.

(10) Patent No.: US 9,559,338 B2
(45) Date of Patent: Jan. 31, 2017

(54) METHOD FOR REPAIRING ORGANIC LIGHT-EMITTING DIODE (OLED) DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Qun Ma, Beijing (CN); Chon Kyu Min, Beijing (CN); Haidong Wu, Beijing (CN)

(73) Assignees: BOE Technology Group Co., Ltd., Beijing (CN); Ordos Yuansheng Optoelectronics Co., Ltd., Ordos, Inner Mongolia (CN)

( * ) Notice: Subject to any disclaimer, the term of this patent is extended or adjusted under 35 U.S.C. 154(b) by 0 days.

(21) Appl. No.: 14/769,309

(22) PCT Filed: Dec. 3, 2014

(86) PCT No.: PCT/CN2014/092895
§ 371 (c)(1),
(2) Date: Aug. 20, 2015

(87) PCT Pub. No.: WO2016/029584
PCT Pub. Date: Mar. 3, 2016

(65) Prior Publication Data
US 2016/0254498 A1    Sep. 1, 2016

(30) Foreign Application Priority Data
Aug. 26, 2014   (CN) .......................... 2014 1 0425967

(51) Int. Cl.
*H01L 21/00*      (2006.01)
*H01L 51/56*      (2006.01)
(Continued)

(52) U.S. Cl.
CPC ........... *H01L 51/56* (2013.01); *H01L 27/3211* (2013.01); *H01L 51/5275* (2013.01); *H01L 2251/568* (2013.01)

(58) Field of Classification Search
CPC ... H01L 51/56; H01L 27/3211; H01L 51/5275
See application file for complete search history.

(56) References Cited

U.S. PATENT DOCUMENTS 8,664,026 B2    3/2014    Tu et al.
8,686,409 B2    4/2014    Lee et al.
(Continued)

FOREIGN PATENT DOCUMENTS

CN    102487111 A    6/2012
CN    103928489 A    7/2014
(Continued)

OTHER PUBLICATIONS

International Search Report of PCT/CN2014/092895 in Chinese, mailed Jun. 5, 2015 with English translation.
(Continued)

*Primary Examiner* — Richard Booth
(74) *Attorney, Agent, or Firm* — Collard & Roe, P.C.

(57) ABSTRACT

A method for repairing an organic light-emitting diode (OLED) display device includes: determining the position of foreign particle (13) in a lamination structure (12); removing the foreign particle (13) and layers over the foreign particle (13) and in a recess region to be formed, so as to form a recess (21) in the lamination structure (12), in which an opening of the recess (21) is towards the external environment; and forming a repair structure (31) in the recess (21), in which the refractive index of the repair structure (31) is less than that of the lamination structure (12). The method
(Continued)

overcomes the black spot defect caused by the foreign particle, improves the product yield and avoids the waste of cost.

14 Claims, 3 Drawing Sheets

(51) Int. Cl.
    *H01L 27/32*     (2006.01)
    *H01L 51/52*     (2006.01)

(56) References Cited

U.S. PATENT DOCUMENTS

| | | | |
|---|---|---|---|
| 9,276,239 B2 * | 3/2016 | Park | ........................ H01L 51/56 |
| 2014/0217383 A1 | 8/2014 | Park et al. | |

FOREIGN PATENT DOCUMENTS

| | | |
|---|---|---|
| CN | 103985823 A | 8/2014 |
| KR | 10-2011-0113089 A | 10/2011 |

OTHER PUBLICATIONS

Notice of Transmittal of the International Search Report of PCT/CN2014/092895 in Chinese, mailed Jun. 5, 2015.
Written Opinion of the International Searching Authority of PCT/CN2014/092895 in Chinese, mailed Jun. 5, 2015 with English translation.
Chinese Office Action in Chinese Application No. 201410425967.4, mailed Jul. 6, 2016 with English translation.

\* cited by examiner

US 9,559,338 B2

METHOD FOR REPAIRING ORGANIC LIGHT-EMITTING DIODE (OLED) DISPLAY DEVICE

CROSS REFERERNC TO RELATED APPLICATIONS

This application is the National Stage of PCT/CN2014/0928295 filed on Dec. 3, 2014, which claims priority under 35 U.S.C. §119 of Chinese Application No. 201410425967.4 filed on Aug. 26, 2014, the disclosure of which is incorporated by reference.

TECHNICAL FIELD

The embodiment of the present invention relates to a method for repairing an organic light-emitting diode (OLED) display device.

BACKGROUND

OLED display devices belong to the currently mainstream display devices and have the advantages of self-luminous property, wide viewing angle, rapid response speed, stable image, high brightness, rich color, high resolution, low driving voltage, low energy consumption, etc.

An OLED display device mainly comprises a thin-film transistor (TFT) array substrate and organic light-emitting diodes (OLEDs) disposed on the TFT array substrate. An OLED generally includes a lamination structure by a hole injection layer (HIL), a hole transport layer (HTL), an emission layer (EML), an electron transport layer (ETL) and a cathode in sequence. An electron injection layer (EIL) may also be disposed between the ETL and the cathode.

In the manufacturing process of the OLED, the above layers are evaporated on a base substrate in sequence, and the inclusion of foreign particle may be caused. The foreign particle will affect the injection and recombination of holes and electrons, and hence a region containing the foreign particle will not emit light. Thus, the problem of black spots in pixels may be caused, and the product yield can be reduced. Because an OLED is a self-luminous device, once the layers are mixed with impurities, it is difficult to repair the OLED. The OLED display has to be dropped if the display quality is severely affected, and hence the rise of cost can be caused.

SUMMARY

An embodiment of the present invention provides a method for repairing an OLED display device, which solves the problem of black spots in pixels caused by impurities, improves the product yield and avoids the waste of cost.

At least one embodiment of the present invention provides a method for repairing an OLED display device. The OLED display device comprises a lamination structure for forming an OLED. The repair method comprises: determining a position of a foreign particle in the lamination structure; removing the foreign particle and layers over the foreign particle and in a recess region to be formed, so as to form a recess in the lamination structure, in which an opening of the recess is towards external environment; and forming a repair structure in the recess, in which a refractive index of the repair structure is less than that of the lamination structure.

For instance, the step of determining the position of the foreign particle in the lamination structure may include: determining a position of a non-luminous point in a display plane, and determining the position of the foreign particle in the lamination structure according to the position of the non-luminous point.

For instance, the step of removing the foreign particle and the layers over the foreign particle and in the recess region to be formed may include: removing the layers over the foreign particle and in the recess region to be formed in sequence from outside to inside by laser until the foreign particle is exposed, and removing the foreign particle by laser.

For instance, the recess may be in a shape of a cylinder, an elliptic cylinder, a rectangle or a cube.

For instance, the step of forming the repair structure in the recess may include: forming the repair structure by a filling material for the repair structure in the recess by vapor deposition process.

For instance, the material for the repair structure may be a transparent insulating material.

For instance, a surface of the repair structure may be level with a surface of the lamination structure.

For instance, the surface of the repair structure may be lower than the surface of the lamination structure; and after the repair structure is formed, the method may further comprise: forming a planarization layer on the repair structure, in which a surface of the planarization layer is level with the surface of the lamination structure.

For instance, the refractive index of the planarization layer may be greater than that of the repair structure.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMERALS

11—Array Substrate; 12—Lamination structure; 13—Foreign Particle; 21—Recess; 31—Repair Structure; 61—Black Spot Area; 121—HIL; 122—HTL; 123—EML; 124—ETL; 125—Cathode; 126—Planarization Layer; 126'—Planarization Layer on Repair Structure.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention shall fall within the scope of protection of the present invention.

An embodiment of the present invention provides a method for repairing an OLED display device. As illustrated in FIGS. 1 to 4, the OLED display device comprises a lamination structure 12 for forming an OLED. The repair method comprises the following steps.

Figure 1:
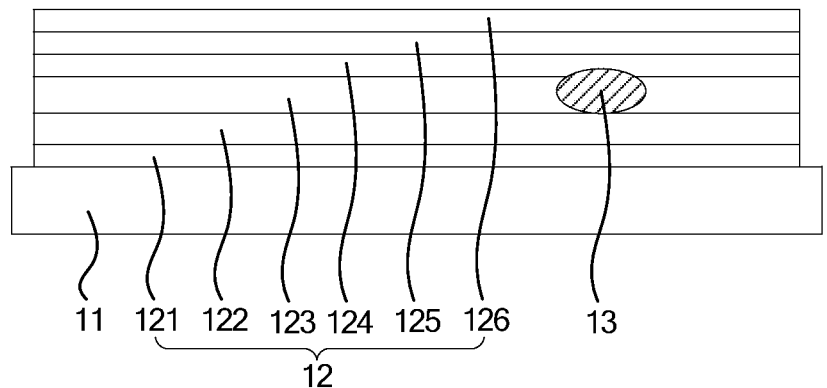
FIGS. 1 to 4 are figures illustrating the steps of a method for repairing an OLED display device, provided by an embodiment of the present invention.

S1: determining the position of foreign particle 13 in the lamination structure 12, as shown in FIG. 1.

The position of the foreign particle 13 in the lamination structure 12 should include the position of the foreign particle in a display plane (namely disposed in which region of the display plane) and the position of the foreign particle in the direction perpendicular to the display plane (namely disposed in which layer of the lamination structure 12). Thus, the step Si may include: determining the position of a non-luminous point in the display plane, and determining the position of the foreign particle 13 in the lamination structure 12 according to the position of the non-luminous point.

It should be noted that: as the foreign particle 13 can prevent the recombination of electrons in the part of a cathode 125 and an ETL 124 disposed over the foreign particle 13 and holes in the part of an HIL 121 and an HTL 122 disposed below the foreign particle 13 in the direction perpendicular to the display plane (the foreign particle 13 prevents electron-hole recombination), light cannot be emitted from the position of the foreign particle 13, and hence a non-luminous point (namely a black spot) can be formed. Therefore, the position of the non-luminous point in the display plane is the position of the foreign particle 13 on the display plane.

Figure 2:
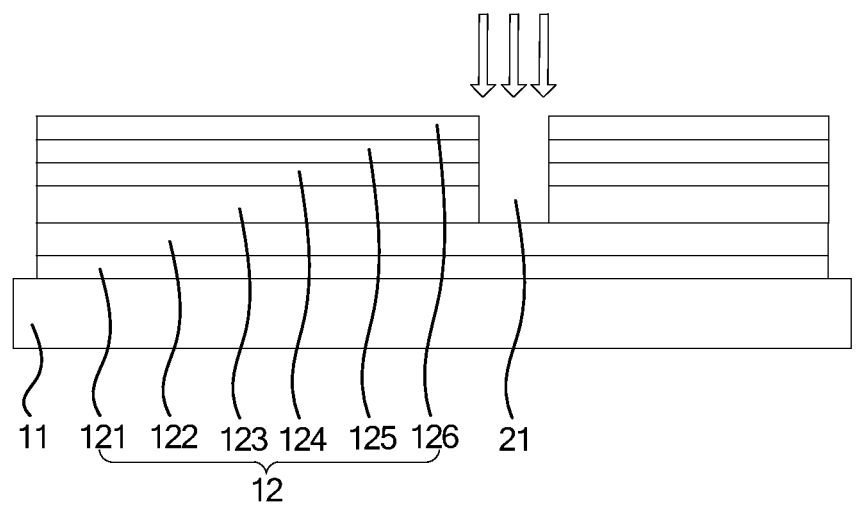

S2: removing the foreign particle 13 and layers that are both over the foreign particle 13 and in a recess region to be formed, so as to form the recess 21 in the lamination structure 12, in which an opening of the recess 21 is towards the external environment, as shown in FIG. 2.

In the step, the process of removing the foreign particle 13 and the layers that are both over the foreign particle 13 and in the recess region to be formed may include: removing the layers over the foreign particle 13 and in the recess region to be formed in sequence from outside to inside with laser until the foreign particle 13 are exposed, and removing the foreign particle 13 by laser as well.

Taking the case as shown in FIG. 1 that the foreign particle 13 is disposed in an EML 123 as an example, in the step parts to be removed include a portion of the ETL 124 and a portion of the cathode 125 disposed over the foreign particle 13. In other embodiments of the present invention, a planarization layer 126 may also cover the cathode 125, or an EIL may also be disposed between the cathode 125 and the ETL 124. Thus, the parts to be removed may further include a portion of the EIL and/or the planarization layer 126 disposed over the foreign particle 13.

It should be noted that: compared with other layer removal processes, the process of removing the foreign particle 13 in a region containing a black spot and the layers over the foreign particle 13 by utilization of high energy of the laser can better avoid the damage to the layers of the OLED and improve the luminescence of the OLED.

In addition, it should be noted that "over the foreign particle 13" herein refers to: disposed on one side of the foreign particle 13 away from an array substrate 11 along the direction perpendicular to the display plane; "recess region to be formed" herein refers to the space occupied by the foreign particle 13 and the space occupied by layer portions directly opposite to the foreign particle 13 in the direction perpendicular to the display plane and disposed on one side of the foreign particle 13 away from the array substrate 11; and "from outside to inside" refers to: from the position away from the array substrate 11 to the position close to the array substrate 11.

The specific shape of the formed recess 21 is not limited in the embodiments. The recess 21 may be in the shape of a cylinder, an elliptic cylinder, a rectangle or a cube. As for the recess with regular shape, the process of removing the foreign particle and the layers by laser can have stronger controllability and be simpler and easier to achieve. The shape of the recess 21 may also be determined by the shape of the foreign particle, so that the unnecessary process of removing certain layers can be avoided, and hence the luminescence of the OLED can be further improved. For instance, the size of the recess 21 may adopt the minimum size of a structure capable of encircling the foreign particle 13.

Figure 3:
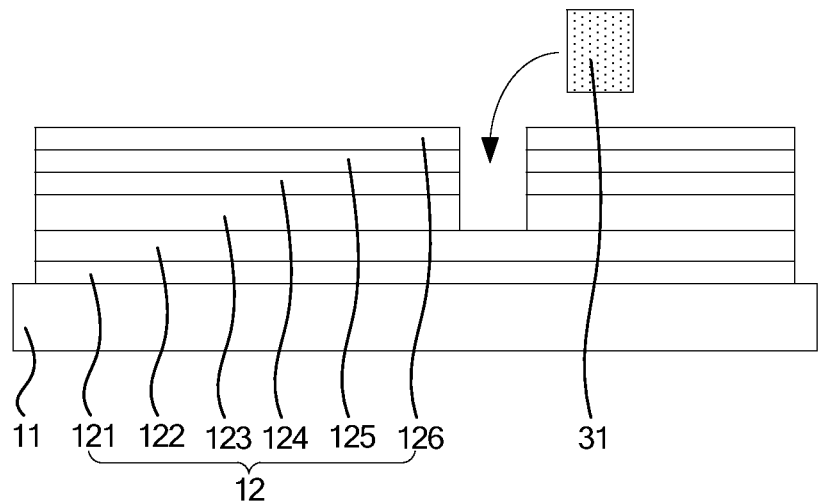

S3: forming a repair structure 31 in the recess 21, in which the refractive index of the repair structure 31 is less than that of the lamination structure 12, as shown in FIG. 3.

Figure 4:
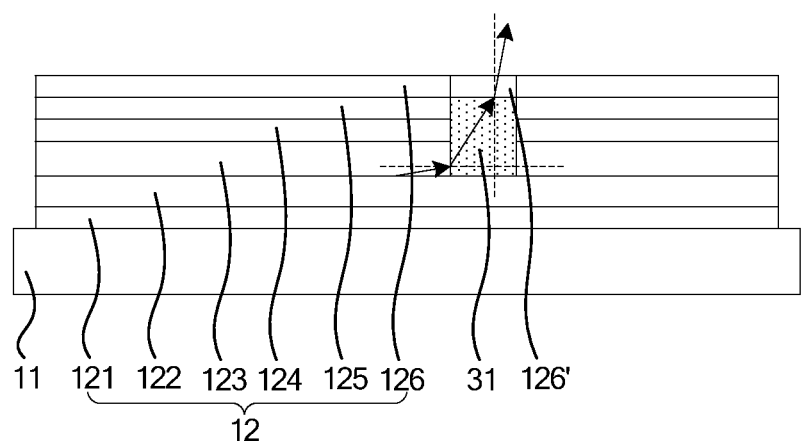
Figure 5:
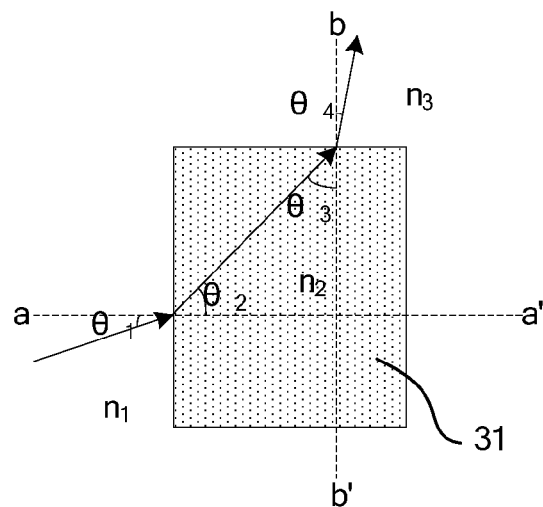
FIG. 5 is an optical path view of light running through a repair structure in the OLED display device repaired by the repair method provided by an embodiment of the present invention.

FIGS. 4 and 5 are optical path views of light running through the repair structure 31 in the OLED display device that has been repaired by the repair method provided by one embodiment of the present invention, in which $n_1$ refers to the refractive index of the lamination structure of the OLED; $n_2$ refers to the refractive index of the repair structure 31; $n_2<n_1$; aa' refers to the normal of the interface of the lamination structure and the repair structure; $\theta_1$ refers to the incident angle of light incident from the lamination structure to the repair structure 31; and $\theta_2$ refers to the refraction angle of the light incident from the lamination structure to the repair structure 31.

According to the refraction principle of light, light emitted by the EML 123 of the lamination structure on the periphery of the repair structure 31 is incident from the lamination structure to the repair structure 31. Because $n_2<n_1$, namely the light is incident from an optically thicker medium to an optically thinner medium, the light will be deflected away from the normal aa', and $\theta_1<\theta_2$. Thus, the light direction is converted to be towards a surface of the repair structure 31 parallel to the display plane (namely an upper surface or a lower surface of the repair structure 31) and the light can be received by human eyes. That is to say, the repair structure 31 has display brightness to some extent. Obviously, the display device repaired by the repair method provided by the embodiment overcomes the black spot defect, improves the product yield, does not require disposal treatment, saves costs and avoids waste.

Figure 6:
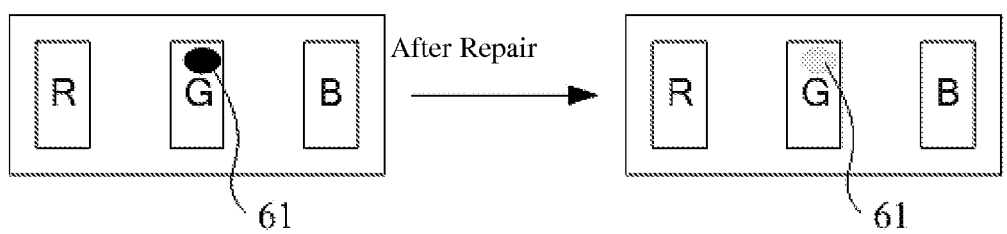
FIG. 6 is a view of comparing pixel display conditions before and after repair in the method for repairing the OLED display device, provided by an embodiment of the present invention.

FIG. 6 is a view of comparing pixel display conditions before and after repair in the method for repairing the OLED display device, provided by one embodiment of the present invention. After repair, the color of the region 61 containing a black spot fades or disappears, so that the region 61 cannot be identified by human eyes. Obviously, the black spot phenomenon of the display device can be eliminated after the display device is repaired by the repair method provided by the embodiment.

For instance, in the step, the process of forming the repair structure 31 in the recess 21 may include: forming the repair structure 31 by filling a material for the repair structure in the recess 21 by vapor deposition process. It should be noted that: compared with the processes such as dropping, spin-coating and printing, the process of filling the material for the repair structure by vapor deposition process can better prevent the layers of the OLED from being polluted by liquid and improve the luminescence of the OLED.

For instance, the material for the repair structure may be a transparent insulating material, so as to ensure that the repair structure 31 has high light transmittance, improve the brightness of the repair structure 31, and enhance the repair effect.

For instance, the shape of the repair structure 31 and the size of the repair structure 31 on the display plane may be the same as the shape of the recess and the size of the recess on the display plane, so that the repair structure 31 can make tight contact with the recess and make optical paths better function, and hence the repair effect can be improved.

In general, the lamination structure 12 is provided with a planarization layer 126 for covering the layers such as the HIL 121, the HTL 122, the EML 123, the ETL 124 and the cathode 125. A part of the planarization layer 126 disposed over the foreign particle 13 is removed in the process of forming the recess 21. Therefore, in the process of forming the repair structure 31, the surface of the repair structure 31 may be level with a surface of the lamination structure 12 (namely level with the surface of the planarization layer 126); or the surface of the repair structure 31 may be lower than the surface of the lamination structure 12 (e.g., may be level with the surface of the cathode 125), and subsequently, a planarization layer 126' is formed on the repair structure; and the surface of the planarization layer 126' is level with the surface of the lamination structure 12 (namely level with the surface of the planarization layer 126), so that the surface of the device can be planarized and the repair structure 31 can be protected.

FIGS. 4 and 5 illustrate the technical proposal in which the surface of the repair structure 31 is lower than the surface of the lamination structure 12 and subsequently the planarization layer 126' is formed on the repair structure. When the refractive index of the planarization layer 126' is $n_3$, the reflective index of the planarization layer 126' may be greater than the reflective index $n_2$ of the repair structure 31, namely $n_2<n_3$. Given that bb' refers to the normal of the planarization layer 126' and the repair structure 31, $\theta_3$ refers to the incident angle of light incident from the repair structure 31 to the planarization layer 126', and $\theta_4$ refers to the refraction angle of the light incident from the repair structure 31 to the planarization layer 126'. According to the refraction principle of light, the light is incident from the repair structure 31 to the planarization layer 126'. As $n_2<n_1$, namely the light is incident from an optically thinner medium to an optically thicker medium, the light will be deflected close to the normal bb', and $\theta_3>\theta_4$, so that the light direction can be further towards the surface of the repair structure 31 parallel to the display plane (namely further approached to be perpendicular to the display plane), and hence the amount of light which runs through the repair structure 31 and is received by human eyes can be increased. Moreover, the display brightness of the repair structure 31 can be further improved, so that the brightness difference between the repair structure 31 and the normally light-emitting position can be further reduced, and hence the removal effect of black spots can be optimized.

It should be noted that the repair method in the embodiment is applicable to various OLED display devices, for instance: any product or component with display function such as e-paper, mobile phone, watch, tablet personal computer (PC), TV, display, notebook computer, digital picture frame and navigator.

In the method for repairing the OLED display device, provided by embodiments of the present invention, the recess is formed by removing the foreign particle causing a black spot defect and corresponding parts of the layers over the foreign particle, and subsequently, the repair structure is formed in the recess; and the refractive index of the repair structure is less than that of the lamination structure of the OLED. According to the refraction principle of light, light is incident from an optically thicker medium to an optically thinner medium and refracted away from the normal. Therefore, after the display device is repaired by the repair method provided by the embodiment of the present invention, a part of light emitted by the EML of the OLED (the optically thicker medium) enters the repair structure (the optically thinner medium), and the direction of the part of light is towards the surface of the repair structure parallel to the display plane; and finally, the light is emitted from the display plane and enters the human eyes. That is to say, the light running through the repair structure can be received by the human eyes. Therefore, the black spot defect caused by the foreign particle can be overcome; the product yield can be improved; costs can be saved; and waste can be avoided.

The foregoing is only the preferred embodiments of the present invention and not intended to limit the scope of protection of the present invention. The scope of protection of the present invention should be defined by the appended claims.

The application claims priority to the Chinese patent application No. 201410425967.4, filed on Aug. 26, 2014, the disclosure of which is incorporated herein by reference as part of the application.

The invention claimed is:

1. A method for repairing an organic light-emitting diode (OLED) display device, the OLED display device comprising a lamination structure for forming an OLED, the repair method comprising:
   determining a position of a foreign particle in the lamination structure;
   removing the foreign particle and layers over the foreign particle and in a recess region to be formed, so as to form a recess in the lamination structure, in which an opening of the recess is towards external environment; and
   forming a repair structure in the recess, in which a refractive index of the repair structure is less than that of the lamination structure, and a surface of the repair structure is lower than a surface of the lamination structure;
   forming a planarization layer on the repair structure, in which a surface of the planarization layer is level with the surface of the lamination structure, wherein a refractive index of the planarization layer is greater than that of the repair structure.

2. The repair method according to claim 1, wherein determining of the position of the foreign particle in the lamination structure includes:
   determining a position of a non-luminous point in a display plane, and determining the position of the foreign particle in the lamination structure according to the position of the non-luminous point.

3. The repair method according to claim 1, wherein removing of the foreign particle and the layers over the foreign particle and in the recess region to be formed includes:
   removing the layers over the foreign particle and in the recess region to be formed in sequence from outside to inside by laser until the foreign particle is exposed, and removing the foreign particle by laser.

4. The repair method according to claim 1, wherein the recess is in a shape of a cylinder, an elliptic cylinder, a rectangle or a cube.

5. The repair method according to claim 1, wherein forming of the repair structure in the recess includes:
  forming the repair structure by a filling material for the repair structure in the recess by vapor deposition process.

6. The repair method according to claim 5, wherein the material for the repair structure is a transparent insulating material.

7. The repair method according to claim 1, wherein a surface of the repair structure is level with a surface of the lamination structure.

8. The repair method according to claim 2, wherein removing of the foreign particle and the layers over the foreign particle and in the recess region to be formed includes:
  removing the layers over the foreign particle and in the recess region to be formed in sequence from outside to inside by laser until the foreign particle is exposed, and removing the foreign particle by laser.

9. The repair method according to claim 2, wherein forming of the repair structure in the recess includes:
  forming the repair structure by a filling material for the repair structure in the recess by vapor deposition process.

10. The repair method according to claim 9, wherein the material for the repair structure is a transparent insulating material.

11. The repair method according to claim 2, wherein a surface of the repair structure is level with a surface of the lamination structure.

12. The repair method according to claim 3, wherein forming of the repair structure in the recess includes:
  forming the repair structure by a filling material for the repair structure in the recess by vapor deposition process.

13. The repair method according to claim 12, wherein the material for the repair structure is a transparent insulating material.

14. The repair method according to claim 3, wherein a surface of the repair structure is level with a surface of the lamination structure.

* * * * *